(12) United States Patent
Sawamura et al.

(10) Patent No.: US 9,911,902 B2
(45) Date of Patent: Mar. 6, 2018

(54) SEMICONDUCTOR LIGHT-EMITTING DEVICE

(71) Applicant: Sharp Kabushiki Kaisha, Sakai, Osaka (JP)

(72) Inventors: Makoto Sawamura, Sakai (JP); Shuhichiroh Yamamoto, Sakai (JP); Shigetoshi Ito, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/375,333

(22) Filed: Dec. 12, 2016

(65) Prior Publication Data
US 2017/0179342 A1 Jun. 22, 2017

(30) Foreign Application Priority Data
Dec. 16, 2015 (JP) .................. 2015-245130

(51) Int. Cl.
*H01L 33/32* (2010.01)
*H01L 33/00* (2010.01)
*H01L 33/20* (2010.01)
*H01L 33/38* (2010.01)
*H01L 33/62* (2010.01)

(52) U.S. Cl.
CPC .......... *H01L 33/32* (2013.01); *H01L 33/0008* (2013.01); *H01L 33/20* (2013.01); *H01L 33/38* (2013.01); *H01L 33/62* (2013.01)

(58) Field of Classification Search
CPC ..... H01L 33/32; H01L 33/0008; H01L 33/20; H01L 33/38; H01L 33/62
See application file for complete search history.

(56) References Cited

U.S. PATENT DOCUMENTS

2012/0235168 A1* 9/2012 Katsuno .................. H01L 33/22
257/88

FOREIGN PATENT DOCUMENTS

| JP | 3312049 B2 | 8/2002 |
|---|---|---|
| JP | 4830356 B2 | 12/2011 |
| JP | 2012-169667 A | 9/2012 |

* cited by examiner

*Primary Examiner* — Tucker J Wright
(74) *Attorney, Agent, or Firm* — Keating & Bennett, LLP

(57) ABSTRACT

A semiconductor light-emitting device includes a first conductivity-type semiconductor including a first electrode on a first main surface, a second conductivity-type semiconductor, and an active layer between a second main surface of the first conductivity-type semiconductor and a first main surface of the second conductivity-type semiconductor. Protrusions are disposed in at least part of a region of a second main surface of the second conductivity-type semiconductor facing the first electrode. A second electrode is disposed in at least part of a region of the second main surface of the second conductivity-type semiconductor except the region having the protrusions. The protrusions containing a dielectric material protrude from the second main surface of the second conductivity-type semiconductor in a direction away from the active layer and are separated by intervals longer than the wavelength of light emitted from the active layer in the medium of the protrusions.

18 Claims, 14 Drawing Sheets

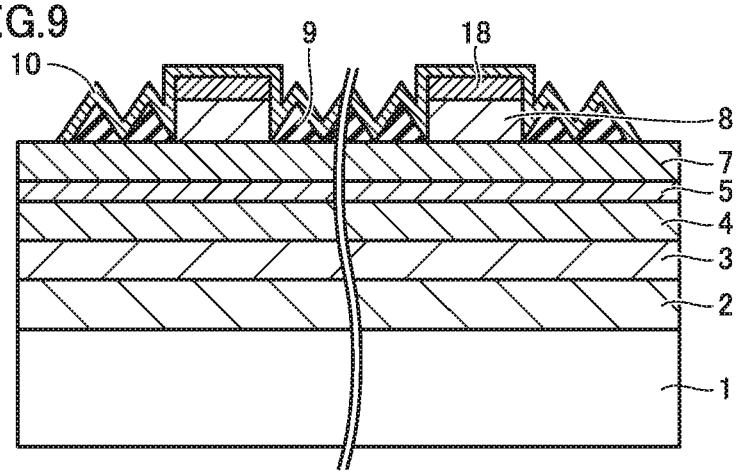
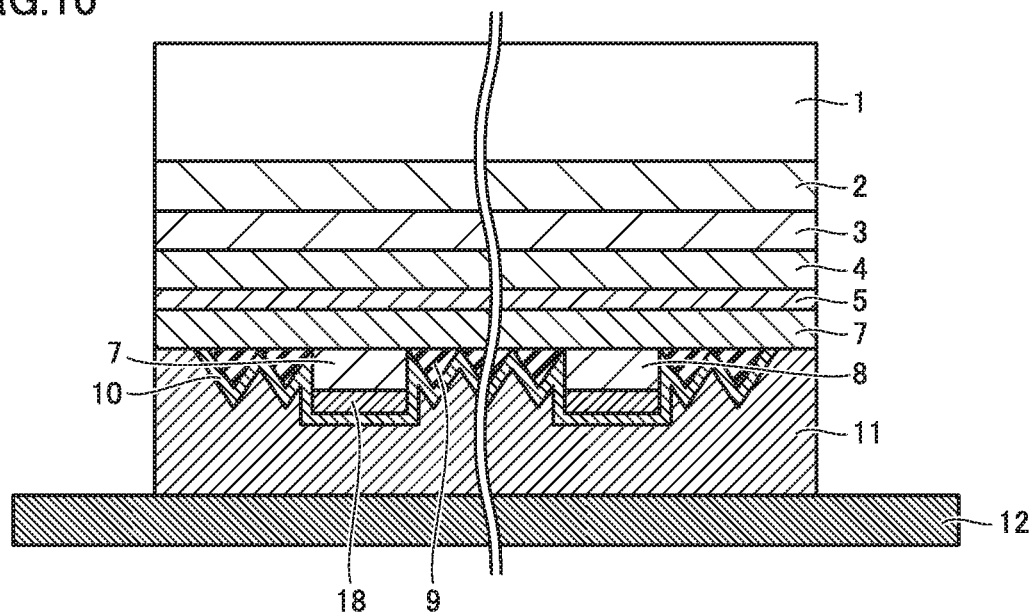

18b  18a
  18

18
18a  18b

SEMICONDUCTOR LIGHT-EMITTING DEVICE

BACKGROUND

1. Field

The present disclosure relates to a semiconductor light-emitting device.

2. Description of the Related Art

FIG. 20 is a schematic cross-sectional view of a GaAs infrared light-emitting device disclosed in Japanese Patent No. 3312049. The GaAs infrared light-emitting device illustrated in FIG. 20 includes a p-type semiconductor layer 111, an n-type semiconductor layer 112, a p-electrode 115 disposed on the p-type semiconductor layer 111, and separated n-electrodes 116 disposed on the n-type semiconductor layer 112. The p-type semiconductor layer 111 and the n-type semiconductor layer 112 have a PN junction plane 113 therebetween. The n-type semiconductor layer 112 has a V-shaped groove 117, which divides the PN junction plane 113. The surface of the n-type semiconductor layer 112 not covered with the n-electrodes 116 is substantially entirely covered with a reflective film 114. The reflective film 114 is a dielectric optical multilayer film.

In the GaAs infrared light-emitting device illustrated in FIG. 20, the V-shaped groove 117, which divides the PN junction plane 113, faces the p-electrode 115 disposed on the light emitting surface. Thus, the V-shaped groove 117 reduces the area of the PN junction plane 113 facing the p-electrode 115. It is therefore argued that the V-shaped groove 117 can reduce the amount of light traveling from the PN junction plane 113 to the p-electrode 115 and thereby reduce the amount of light blocked by the p-electrode 115 and improve light emission efficiency.

FIG. 21 is a schematic cross-sectional view of a micro LED array disclosed in Japanese Patent No. 4830356. The micro LED array illustrated in FIG. 21 includes a transparent electrode 121 containing indium tin oxide (ITO), an n-electrode 122 embedded in part of the transparent electrode 121, an n-type GaAs layer 123 disposed on the transparent electrode 121 and the n-electrode 122, an n-type AlGaInP layer 124 disposed on the n-type GaAs layer 123, a multiple quantum well (MQW) active layer 125 disposed on the n-type AlGaInP layer 124, the MQW active layer 125 including an AlGaInP layer and a GaInP layer alternately stacked on top of one another, a p-type semiconductor layer 126 including a p-type AlGaInP layer and a p-type GaInP layer, the p-type semiconductor layer 126 having a textured structure including a pair of inclined reflective (111) and (11-1) planes, a low-refractive-index film 127 filling part of the textured structure of the p-type semiconductor layer 126, a p-type GaAs layer 128 disposed on the p-type semiconductor layer 126, a p-electrode 129 covering the textured structure of the p-type semiconductor layer 126 and the p-type GaAs layer 128, a light reflecting metal layer 130 disposed on the p-type semiconductor layer 126 and covering the p-electrode 129, a lead electrode 132 disposed on and electrically connected to the light reflecting metal layer 130, a mold resin layer 131, and a concave mirror 133 having a large radius of curvature.

Each of the p-type AlGaInP layer and the p-type GaInP layer of the p-type semiconductor layer 126 contains phosphorus. Thus, the inclined reflective surfaces of the p-type semiconductor layer 126 are formed by wet etching using hydrochloric acid as an etchant utilizing different etch rates of different crystal faces. The pair of inclined reflective surfaces of the p-type semiconductor layer 126 form a V-shaped groove, which does not reach the MQW active layer 125.

In the micro LED array illustrated in FIG. 21, it is argued that the pair of inclined reflective surfaces of the p-type semiconductor layer 126 can confine the electric current between these inclined reflective surfaces and allows the electric current to flow into a limited region of the MQW active layer 125 rather than a nonradiative recombination region, such as an end surface of the device, thus improving luminous efficiency.

In the GaAs infrared light-emitting device illustrated in FIG. 20 and described in Japanese Patent No. 3312049, however, the V-shaped groove 117, which divides the PN junction plane 113, reduces the area of the PN junction plane 113 that is involved in light emission and thereby reduces light extraction efficiency. When the device structure illustrated in FIG. 20 is applied to a semiconductor light-emitting device containing $Al_xGa_yN$ (0<x≤1, 0≤y<1), in order to sufficiently activate the p-type semiconductor layer 111, the p-type semiconductor layer 111 can contain p-type GaN or p-type AlGaN having a low Al content. However, such a p-type semiconductor layer 111 greatly absorbs light emitted from the PN junction plane 113 and reduces light extraction efficiency.

When the device structure illustrated in FIG. 21 and described in Japanese Patent No. 4830356 is applied to a semiconductor light-emitting device containing $Al_xGa_yN$ (0<x≤1, 0≤y<1), in order to sufficiently activate the p-type semiconductor layer 126, the p-type semiconductor layer 126 can contain p-type GaN or p-type AlGaN having a low Al content. However, p-type GaN and p-type AlGaN having a low Al content are resistant to wet etching, making it difficult to form the inclined reflective surfaces. When the transparent electrode 121, for example, containing ITO is applied to a semiconductor light-emitting device containing $Al_xGa_yN$ (0<x≤1, 0≤y<1), the transparent electrode 121 has a great optical absorption loss and reduces light extraction efficiency.

SUMMARY

A semiconductor light-emitting device according to an embodiment disclosed herein is a semiconductor light-emitting device containing $Al_xGa_yN$ (0<x≤1, 0≤y<1). The semiconductor light-emitting device includes a first conductivity type semiconductor, a second conductivity type semiconductor, an active layer between the first conductivity type semiconductor and the second conductivity type semiconductor, first electrodes disposed on a first main surface of the first conductivity type semiconductor, a second electrode disposed on a second main surface of the second conductivity type semiconductor, and protrusions disposed on the second main surface of the second conductivity type semiconductor. The first main surface of the first conductivity type semiconductor faces the second main surface of the second conductivity type semiconductor with the first conductivity type semiconductor, the active layer, and the second conductivity type semiconductor interposed therebetween. The protrusions are disposed in at least part of a region of the second main surface of the second conductivity type semiconductor facing each of the first electrodes. The second electrode is disposed in at least part of a region of the second main surface of the second conductivity type semiconductor other than the region in which the protrusions are disposed. The protrusions protrude from the second main surface of the second conductivity type semiconductor in a direction away from the active layer. The protrusions contain a dielectric material. The protrusions are separated by an interval longer than the wavelength of light emitted from the active layer in the medium of the protrusions.

BRIEF DESCRIPTION OF THE DRAWINGS

FIG. 9 is a schematic cross-sectional view illustrating a method for manufacturing the semiconductor light-emitting device according to the first embodiment;

FIG. 10 is a schematic cross-sectional view illustrating a method for manufacturing the semiconductor light-emitting device according to the first embodiment;

DESCRIPTION OF THE EMBODIMENTS

Figure 1:
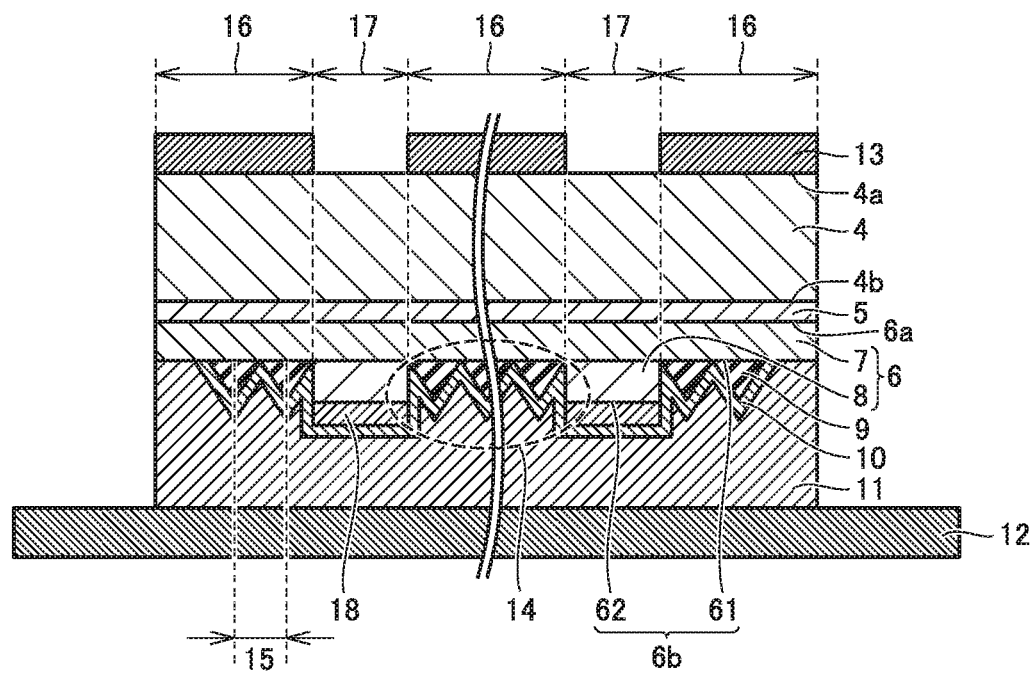
FIG. 1 is a schematic cross-sectional view of a semiconductor light-emitting device according to a first embodiment.

Embodiments of the present disclosure will be described below. Like reference numerals denote like parts or equivalents thereof throughout the figures illustrating the embodiments.

First Embodiment

FIG. 1 is a schematic cross-sectional view of a semiconductor light-emitting device according to a first embodiment. As illustrated in FIG. 1, the semiconductor light-emitting device according to the first embodiment includes a first conductivity type semiconductor 4, for example, an n-type semiconductor, a second conductivity type semiconductor 6, for example, a p-type semiconductor, and an active layer 5 disposed between a second main surface 4b of the first conductivity type semiconductor 4 and a first main surface 6a of the second conductivity type semiconductor 6. In the first embodiment, the first conductivity type semiconductor 4 may be an n-type nitride semiconductor clad layer containing n-type $Al_{x1}Ga_{y1}N$ ($0<x1\le1$, $0\le y1<1$). The second conductivity type semiconductor 6 may be a multilayer body composed of a p-type nitride semiconductor layer 7 containing p-type $Al_{x2}Ga_{y2}N$ ($0<x2\le1$, $0\le y2<1$) and a p-type nitride semiconductor highly doped layer 8 containing p-type $Al_{x3}Ga_{y3}N$ ($0<x3\le1$, $0\le y3<1$). The active layer 5 may be a single quantum well (SQW) or multiple quantum well (MQW) active layer containing $Al_{x4}Ga_{y4}N$ ($0<x4\le1$, $0\le y4<1$).

A first main surface 4a of the first conductivity type semiconductor 4 faces a second main surface 6b of the second conductivity type semiconductor 6 with the first conductivity type semiconductor 4, the active layer 5, and the second conductivity type semiconductor 6 interposed therebetween. The first main surface 4a of the first conductivity type semiconductor 4 includes an electrode forming region (a first region 16) that includes a first electrode 13 serving as an n-electrode, and an electrode-free region (a second region 17) that includes no first electrode 13. The first main surface 4a of the first conductivity type semiconductor 4 is a light extraction surface of the semiconductor light-emitting device according to the first embodiment.

Protrusions 9 are disposed in a region (a third region 61) of the second main surface 6b of the second conductivity type semiconductor 6, which faces a region (the first region 16) that includes the first electrode 13 on the first main surface 4a of the first conductivity type semiconductor 4. The p-type nitride semiconductor highly doped layer 8 is disposed in a region (a fourth region 62) of the second main surface 6b of the second conductivity type semiconductor 6, which faces a region (the second region 17) that includes no first electrode 13 on the first main surface 4a of the first conductivity type semiconductor 4. The p-type nitride semiconductor highly doped layer 8 contains magnesium (Mg) as a p-type impurity.

The protrusions 9 contain a dielectric material and protrude from the second main surface 6b of the second conductivity type semiconductor 6 in a direction away from the active layer 5. The intervals 15 between the protrusions 9 are the shortest distances between adjacent tops of the protrusions 9. The p-type nitride semiconductor highly doped layer 8 protrudes from the p-type nitride semiconductor layer 7 in a direction away from the active layer 5 and has a higher p-type impurity concentration than the p-type nitride semiconductor layer 7.

A second electrode 18 serving as a p-electrode is disposed on a main surface of the p-type nitride semiconductor highly doped layer 8 opposite the active layer 5. The p-type nitride semiconductor highly doped layer 8, the protrusions 9, and the second electrode 18 are covered with a metal layer 10. The metal layer 10 is mechanically and electrically bonded to an electrically conductive substrate 12 with an electrically conductive bonding layer 11.

Figure 2:
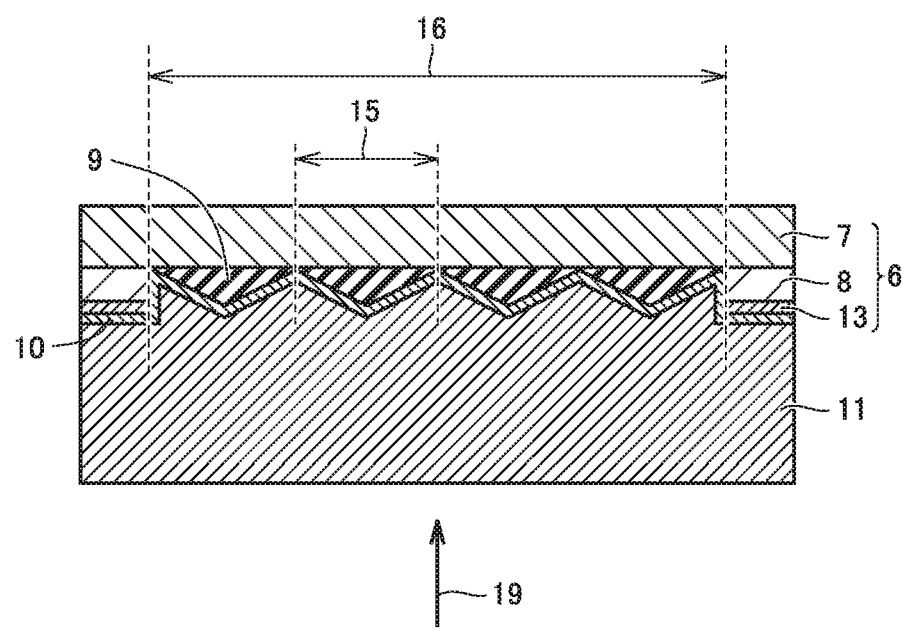
FIG. 2 is a schematic enlarged cross-sectional view of a portion within the broken line in FIG. 1.
Figure 3A:
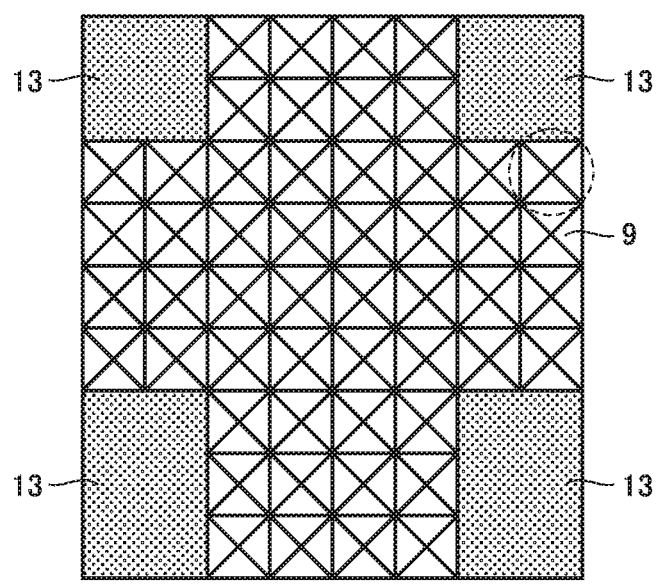
FIG. 3A is a schematic plan view of the protrusions viewed in the direction of the arrow in FIG. 2.
Figure 3B:
FIG. 3B is a schematic plan view of one of the protrusions.

FIG. 2 is a schematic enlarged cross-sectional view of a portion within the broken line 14 in FIG. 1. FIG. 3A is a schematic plan view of the protrusions 9 viewed in the direction of the arrow 19 in FIG. 2, and FIG. 3B is a schematic plan view of one of the protrusions 9 illustrated in FIG. 3A. In the first embodiment, the protrusions 9 are quadrangular pyramids that protrude in a direction away from the active layer 5. The tops of the quadrangular pyramidal protrusions 9 are the farthest points from the active layer 5. The intervals 15 between the protrusions 9 are greater than the wavelength $\lambda 1$ of light emitted from the active layer 5 propagating through the medium of the protrusions 9.

In the semiconductor light-emitting device according to the first embodiment, the protrusions 9 containing a dielectric material are disposed in the region (the third region 61) of the second main surface 6b of the second conductivity type semiconductor 6 facing the first electrode 13, and the intervals 15 between the protrusions 9 are greater than the wavelength $\lambda 1$ of light emitted from the active layer 5 in the medium of the protrusions 9. This can reduce the amount of light traveling to the first electrode 13 out of light emitted from the active layer 5, propagating through the second conductivity type semiconductor 6, reflected from the interface between the protrusions 9 and another medium (the metal layer 10 in the first embodiment), and traveling in the direction of the first electrode 13. This can reduce the amount of light absorbed by the first electrode 13 and improve light extraction efficiency (the ratio of the amount of light extracted from the device to the amount of electric current flowing into the device) in the semiconductor light-emitting device according to the first embodiment.

Figure 4A:
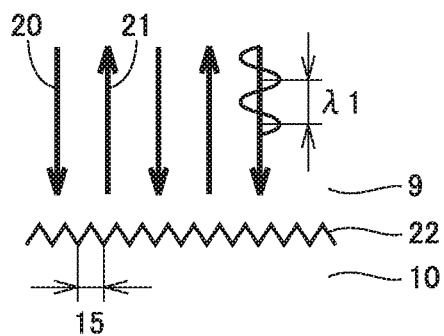
FIGS. 4A to 4C are schematic views illustrating the principle of controlling the direction of light reflection with protrusions.

The principle of controlling the direction of light reflection with the protrusions 9 will be described below with reference to FIGS. 4A to 4C. In FIG. 4A, incident light 20 is reflected as reflected light 21 by an interface 22 between the protrusions 9 and a medium (the metal layer 10 in the first embodiment) adjacent to the protrusions 9. The wavelength $\lambda 1$ of the incident light 20 in the medium of the protrusions 9 is represented by $\lambda 1 = \lambda 0/n$, wherein n denotes the refractive index of the dielectric material of the protrusions 9, and $\lambda 0$ denotes the wavelength of the incident light 20 in a vacuum.

Figure 4B:
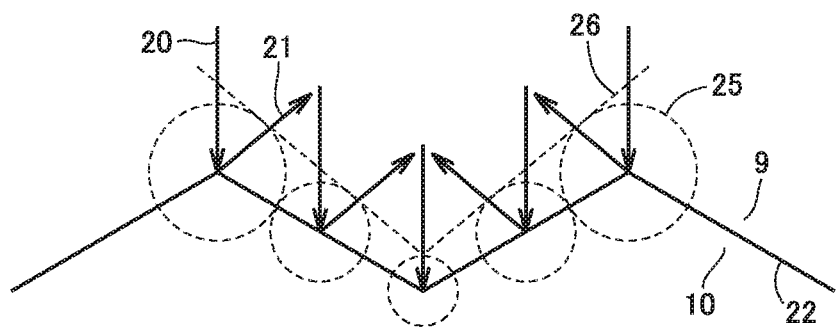
Figure 4C:
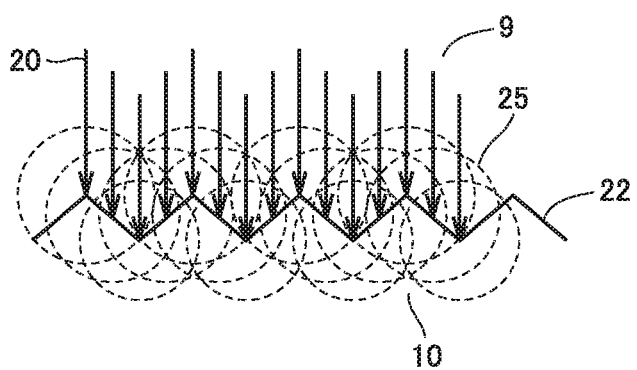

FIGS. 4B and 4C are schematic enlarged cross-sectional views of the protrusions 9. When incident light 20 propagating in the direction perpendicular to the second main surface 6b of the second conductivity type semiconductor 6 is incident on the protrusions 9, the incident light 20 is scattered at each point on the inclined surfaces of the protrusions 9 according to the Huygens' principle.

FIG. 4B illustrates light scattering in the case where the intervals 15 between the protrusions 9 are greater than the wavelength $\lambda 1$ of light emitted from the active layer 5 in the medium of the protrusions 9. When the incident light 20 propagates from the active layer 5 to the second conductivity type semiconductor 6, is reflected from an interface, and is incident at each point on the inclined surfaces of the protrusions 9, the incident light 20 is scattered as a spherical wave at each point and forms wavefronts of scattered light 25 in the same phase. FIG. 4B illustrates the envelope surface 26 of the wavefronts of scattered light 25. The traveling direction of the scattered light 21 of the incident light 20 propagating in the direction perpendicular to the second main surface 6b of the second conductivity type semiconductor 6 and incident on the protrusions 9 is perpendicular to the envelope surface 26 and is not perpendicular to the second main surface 6b of the second conductivity type semiconductor 6.

FIG. 4C illustrates light scattering in the case where the intervals 15 between the protrusions 9 are smaller than or equal to the wavelength $\lambda 1$ of light emitted from the active layer 5 in the medium of the protrusions 9. In this case, the envelope surface of wavefronts of scattered light 25 of the incident light 20 propagating from the active layer 5 to the second conductivity type semiconductor 6, reflected from an interface, and incident at each point on the inclined surfaces of the protrusions 9 is substantially flat, although the envelope surface has fine asperities. Thus, in this case, the traveling direction of the scattered light 21 of the incident light 20 propagating in the direction perpendicular to the second main surface 6b of the second conductivity type semiconductor 6 and incident on the protrusions 9 is perpendicular to the second main surface 6b of the second conductivity type semiconductor 6.

WO2011/065571A1 discloses that the traveling direction of the reflected light 21 can be controlled in the case where the intervals 15 between the protrusions 9 are greater than the wavelength $\lambda 1$ of light emitted from the active layer 5 in the medium of the protrusions 9.

Thus, in the semiconductor light-emitting device according to the first embodiment, the interface between the protrusions 9 and another medium can change the traveling direction of light propagating in the direction perpendicular to the second main surface 6b of the second conductivity type semiconductor 6 and incident on and reflected from the protrusions 9 such that the reflected light does not travel toward the first electrode 13. This can reduce the amount of light absorbed by the first electrode 13 and improve light extraction efficiency.

Figure 21:
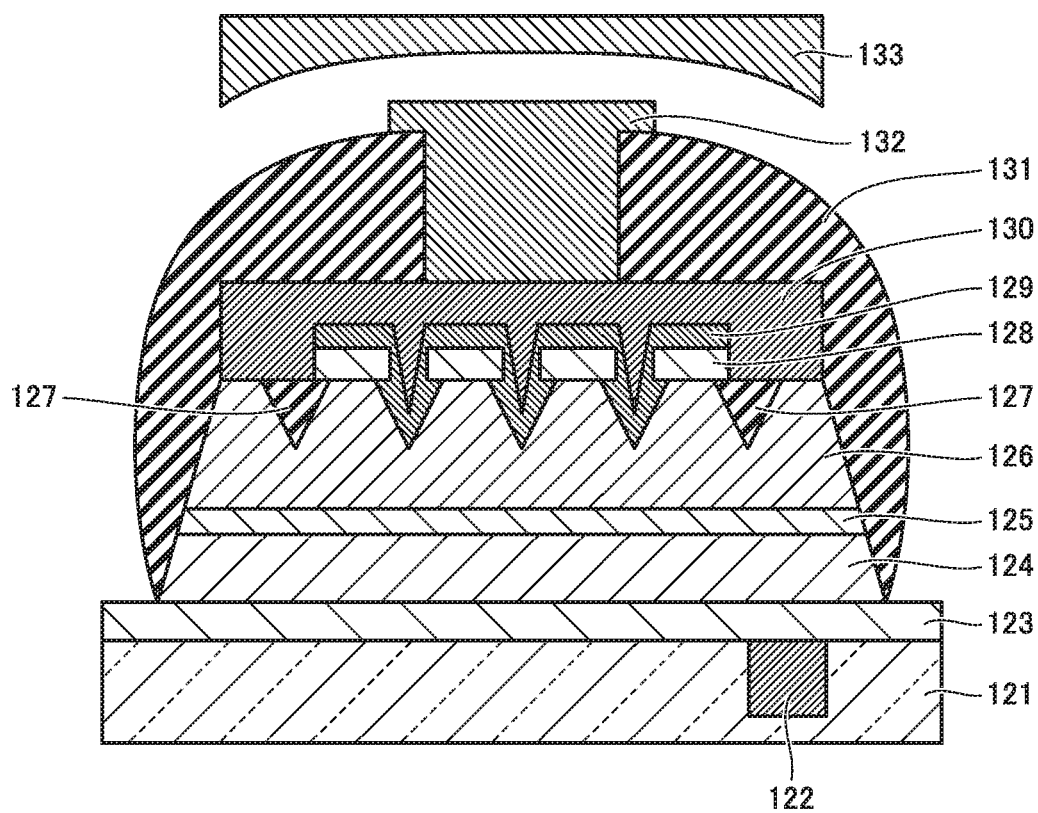
FIG. 21 is a schematic cross-sectional view of a micro LED array disclosed in Japanese Patent No. 4830356.

Theoretically, the textured structure of the p-type semiconductor layer 126 illustrated in FIG. 21 and described in Japanese Patent No. 4830356 can also control the traveling direction of light as in the semiconductor light-emitting device according to the first embodiment. However, in order to form the textured structure on the p-type semiconductor layer 126, the p-type semiconductor layer 126 has a certain thickness due to the device structure described in Japanese Patent No. 4830356. In the device structure described in Japanese Patent No. 4830356, therefore, the p-type semiconductor layer 126 causes a great loss due to absorption of light. By contrast, in the semiconductor light-emitting device according to the first embodiment, the protrusions 9 containing a dielectric material instead of the second conductivity type semiconductor 6 have the function of controlling the traveling direction of light. This can reduce the thickness of the second conductivity type semiconductor 6. Thus, in the semiconductor light-emitting device according to the first embodiment, the thickness of the second conductivity type semiconductor 6 can be reduced to minimize loss due to absorption of light in the second conductivity type semiconductor 6 and further improve light extraction efficiency.

In the semiconductor light-emitting device according to the first embodiment, the second electrode 18 is disposed in the fourth region 62 of the second main surface 6b of the second conductivity type semiconductor 6, which does not face the first electrode 13. Thus, the first electrode 13 and the second electrode 18 do not face each other across the active layer 5. This can widen the electric current path from the second electrode 18 to the first electrode 13 and extend the light-emitting region in the active layer 5.

In the semiconductor light-emitting device according to the first embodiment, the metal layer 10 covering the protrusions 9 and the second electrode 18 is electrically and mechanically bonded to the electrically conductive substrate 12 with the electrically conductive bonding layer 11. Thus, the semiconductor light-emitting device according to the first embodiment can easily establish electrical continuity and simplify a process of mounting the device, thus resulting in lower manufacturing costs.

In the semiconductor light-emitting device according to the first embodiment, the protrusions 9 and the metal layer 10 covering the protrusions 9 form an interface, and the amount of light passing through the interface can be reduced.

Figure 20:
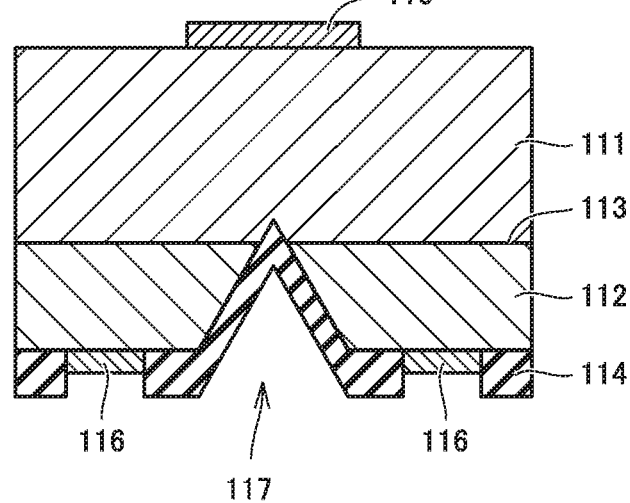
FIG. 20 is a schematic cross-sectional view of a GaAs infrared light-emitting device disclosed in Japanese Patent No. 3312049.

In the device structure illustrated in FIG. 20 and described in Japanese Patent No. 3312049, the V-shaped groove 117, which divides the PN junction plane 113, reduces the area of the PN junction plane 113 that is involved in light emission. By contrast, the semiconductor light-emitting device according to the first embodiment has no groove that divides the active layer 5 and can avoid such a problem.

A method for manufacturing the semiconductor light-emitting device according to the first embodiment will be described below with reference to the schematic cross-sectional views of FIGS. 5 to 12.

Figure 5:
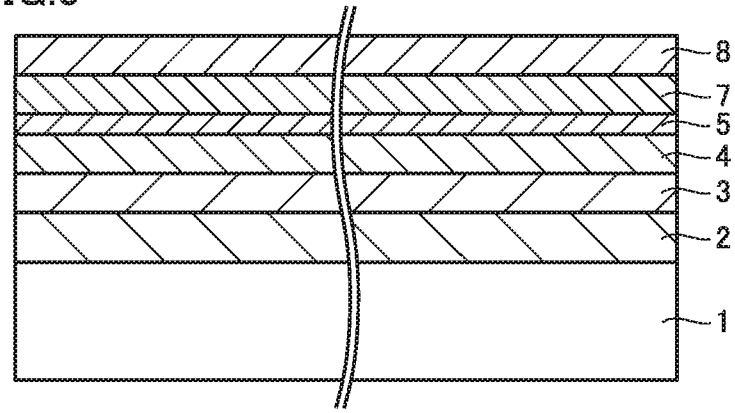
FIG. 5 is a schematic cross-sectional view illustrating a method for manufacturing the semiconductor light-emitting device according to the first embodiment.

First, as illustrated in FIG. 5, an AlN buffer layer 2, an AlGaN underlayer 3, the first conductivity type semiconductor 4, the active layer 5, the p-type nitride semiconductor layer 7, and the p-type nitride semiconductor highly doped layer 8 are stacked on a sapphire substrate 1 in this order by a metal organic chemical vapor deposition (MOCVD) method. The sapphire substrate 1 may be replaced by an AlN substrate.

Figure 6:
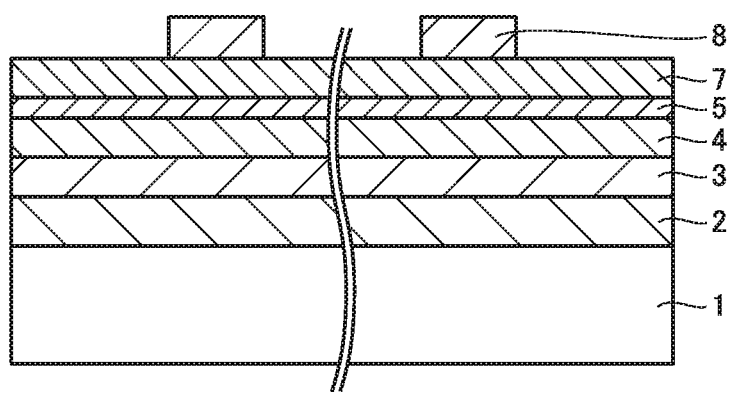
FIG. 6 is a schematic cross-sectional view illustrating a method for manufacturing the semiconductor light-emitting device according to the first embodiment.

As illustrated in FIG. 6, a portion of the p-type nitride semiconductor highly doped layer 8 other than a portion in which the second electrode 18 is to be formed is then removed. The p-type nitride semiconductor highly doped layer 8 can be removed, for example, by dry etching, such as reactive ion etching, after a resist pattern is formed on the p-type nitride semiconductor highly doped layer 8 by photolithography. Removal of an unnecessary portion of the p-type nitride semiconductor highly doped layer 8 can reduce the amount of light emitted from the active layer 5 and absorbed by the p-type nitride semiconductor highly doped layer 8 and thereby improve light extraction efficiency.

After the p-type nitride semiconductor highly doped layer 8 is partly removed, the semiconductor wafer is heated. For example, the semiconductor wafer can be heated to 800° C. or more in a heat treatment furnace.

Figure 7:
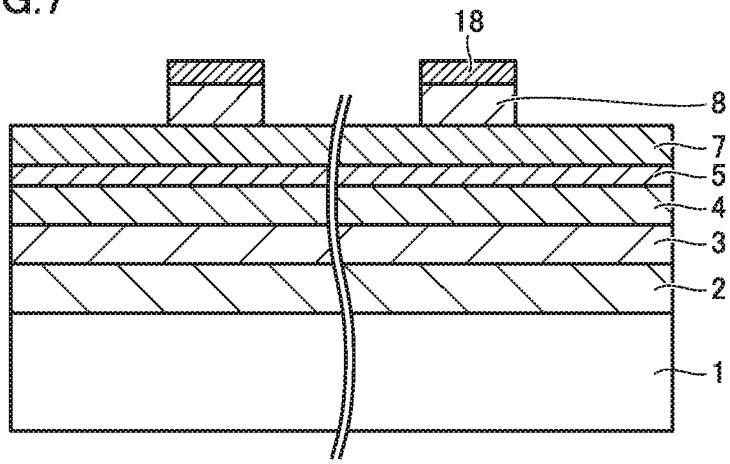
FIG. 7 is a schematic cross-sectional view illustrating a method for manufacturing the semiconductor light-emitting device according to the first embodiment.

As illustrated in FIG. 7, the second electrode 18 is then formed on the p-type nitride semiconductor highly doped layer 8. For example, the second electrode 18 can be formed by forming a resist pattern on the p-type nitride semiconductor highly doped layer 8 by photolithography, successively forming a nickel (Ni) layer having a thickness of 20 nm and a gold (Au) layer having a thickness of 20 nm by an electron-beam evaporation method, and performing lift-off. Instead of the Ni and Au layers, the second electrode 18 may be composed of platinum (Pt) and Au layers or palladium (Pd) and Au layers. The second electrode 18 may be formed by a known sputtering method as well as the electron-beam evaporation method. The second electrode 18 can provide good ohmic characteristics and provide good adhesion to the electrically conductive substrate 12. Before the protrusions 9 are formed, the p-type nitride semiconductor highly doped layer 8 can be covered with the second electrode 18 in order to reduce damage to the p-type nitride semiconductor highly doped layer 8 in the subsequent process.

Figure 8:
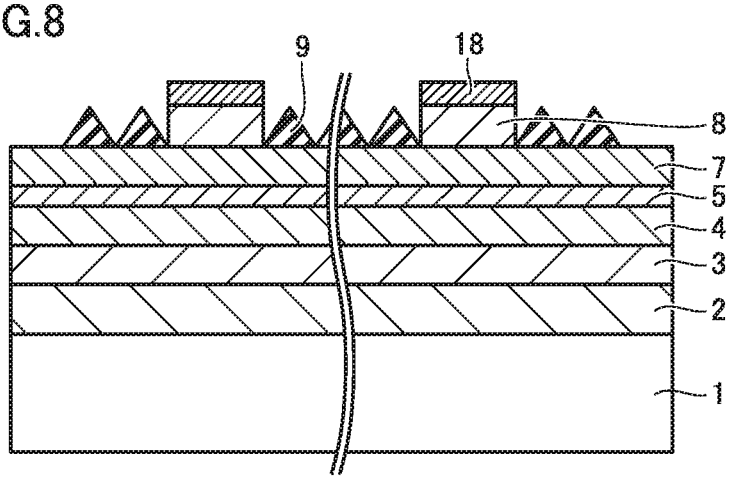
FIG. 8 is a schematic cross-sectional view illustrating a method for manufacturing the semiconductor light-emitting device according to the first embodiment.

As illustrated in FIG. 8, the protrusions 9 are then formed on the p-type nitride semiconductor layer 7. For example, the protrusions 9 can be formed as described below. First, a dielectric film, such as an AlN film, is formed on the p-type nitride semiconductor layer 7 by a known sputtering method. A resist pattern is then formed on the dielectric film by photolithography. The dielectric film is then partly removed by dry etching, such as reactive ion etching, so as to form a periodic fine uneven pattern. The protrusions 9 can be formed in this manner. Light having a wavelength in an ultraviolet region (1 to 400 nm) has a refractive index in the range of approximately 2.3 to 2.6 in $Al_xGa_yN$ ($0<x\leq1$, $0\leq y<1$). AlN has a refractive index of approximately 2.3. When the protrusions 9 are formed of AlN, this can reduce the refractive index difference at the interface between the protrusions 9 and the p-type nitride semiconductor layer 7 and reduce total reflection, thus allowing the reflection direction of more light to be controlled. The protrusions 9 may be formed of a material other than AlN, for example, a dielectric material that has a refractive index close to the refractive index of the p-type nitride semiconductor layer 7 for light having a wavelength in an ultraviolet region (1 to 400 nm) and is transparent to the light. The protrusions 9 may be formed at a desired etching angle (taper angle) by changing the etching conditions, such as the ambient gas, of dry etching, such as reactive ion etching, so as to adjust the dry etching rate in the thickness direction and in the in-plane direction. The protrusions 9 may be quadrangular pyramids.

The protrusions 9 are formed such that the intervals 15 between the protrusions 9 are smaller than or equal to the wavelength $\lambda1$ of light emitted from the active layer 5 in the medium of the protrusions 9. The intervals 15 between the protrusions 9 can be determined by dividing the semiconductor light-emitting device or by cross-sectioning the semiconductor light-emitting device with a focused ion beam (FIB) and by measuring the distance between adjacent tops of the protrusions 9 with an electron microscope. The wavelength $\lambda1$ in the medium of the protrusions 9 can be calculated by observing light emitted from the semiconductor light-emitting device with a photodetector, determining the wavelength $\lambda0$ in air, and determining the refractive index n of the protrusions 9 by spectroscopic ellipsometry analysis. The wavelength $\lambda1$ is represented by $\lambda1=(\lambda0 \times n0)/$ n, wherein λ0 denotes the wavelength in air, n0 denotes the refractive index of air, and n denotes the refractive index of the protrusions 9.

As illustrated in FIG. 9, the protrusions 9, the p-type nitride semiconductor highly doped layer 8, and the second electrode 18 are then covered with the metal layer 10. The metal layer 10 may be formed by stacking an aluminum (Al) layer having a thickness of 300 nm and a Au layer having a thickness of 300 nm in this order by a sputtering method. A reflection interface between the metal layer 10 containing Al and having high reflectance for light having a wavelength in an ultraviolet region and the protrusions 9 containing a dielectric material can reduce the amount of light passing through the reflection interface. The metal layer 10 can enhance bonding to the electrically conductive substrate 12 with the electrically conductive bonding layer 11 as compared with the protrusions 9 and can improve the yield.

As illustrated in FIG. 10, the metal layer 10 and the electrically conductive substrate 12 are then bonded together with the electrically conductive bonding layer 11. The metal layer 10 and the electrically conductive substrate 12 can be bonded together with the electrically conductive bonding layer 11 as described below. First, a bonding metal layer (not shown), such as a multilayer body composed of a Ni layer having a thickness of 20 nm and a Au layer having a thickness of 150 nm, is formed on the electrically conductive substrate 12, such as a CuW substrate or a Si substrate doped with a p-type semiconductor. The electrically conductive bonding layer 11 is then placed so as to face the metal layer 10.

The electrically conductive bonding layer 11 may be a thermosetting electrically conductive adhesive containing silver (Ag) or may be formed of Au, tin (Sn), Pd, indium (In), titanium (Ti), Ni, tungsten (W), molybdenum (Mo), Au—Sn, Sn—Pd, In—Pd, Ti—Pt—Au, or Ti—Pt—Sn. The electrically conductive bonding layer 11 formed of such a material can be bonded to the metal layer 10 through an eutectic reaction. An eutectic layer formed by the eutectic reaction and the metal layer 10 diffuse into each other and form eutectic crystals.

The sapphire substrate 1 and the electrically conductive substrate 12 are then heat-pressed. When the electrically conductive bonding layer 11 is a thermosetting electrically conductive adhesive, the sapphire substrate 1 and the electrically conductive substrate 12 may be pressed at hundreds of newtons to several kilonewtons, may be heated to approximately 150° C. to 400° C., and may be held in a vacuum, in a nitrogen atmosphere, or in the air for approximately 15 minutes. While the sapphire substrate 1 and the electrically conductive substrate 12 are heat-pressed, the electrically conductive bonding layer 11 melts and then solidifies, thereby bonding the metal layer 10 and the electrically conductive substrate 12 together.

The bonding conditions without pressing may include heating at approximately 200° C. in a vacuum, in a nitrogen atmosphere, or in the air for approximately 60 minutes. The bonding conditions depend on the characteristics of the material of the electrically conductive bonding layer 11. The electrically conductive substrate 12, the metal layer 10, and the second electrode 18 are electrically bonded together with the electrically conductive bonding layer 11, thereby enabling electric current input.

Before the next laser lift-off (LLO) process, the back side (a surface opposite the electrically conductive bonding layer 11) of the sapphire substrate 1 may be ground and polished such that the sapphire substrate 1 has a desired thickness.

Figure 11:
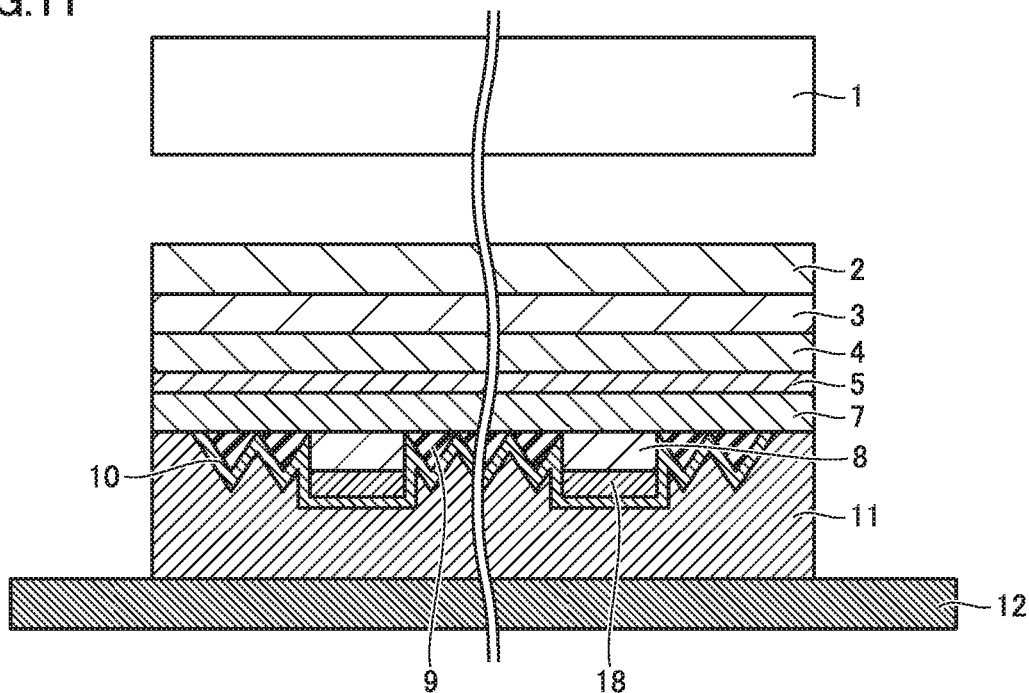
FIG. 11 is a schematic cross-sectional view illustrating a method for manufacturing the semiconductor light-emitting device according to the first embodiment.

As illustrated in FIG. 11, the sapphire substrate 1 is then separated from the AlN buffer layer 2. For example, the sapphire substrate 1 is separated from the AlN buffer layer 2 by a LLO method. More specifically, the sapphire substrate 1 is separated from the AlN buffer layer 2 by irradiating the back side of the sapphire substrate 1 with an excimer laser beam having a wavelength of approximately 193 nm. The excimer laser beam may have an energy density in the range of approximately 500 to 8000 mJ/cm$^2$.

Figure 12:
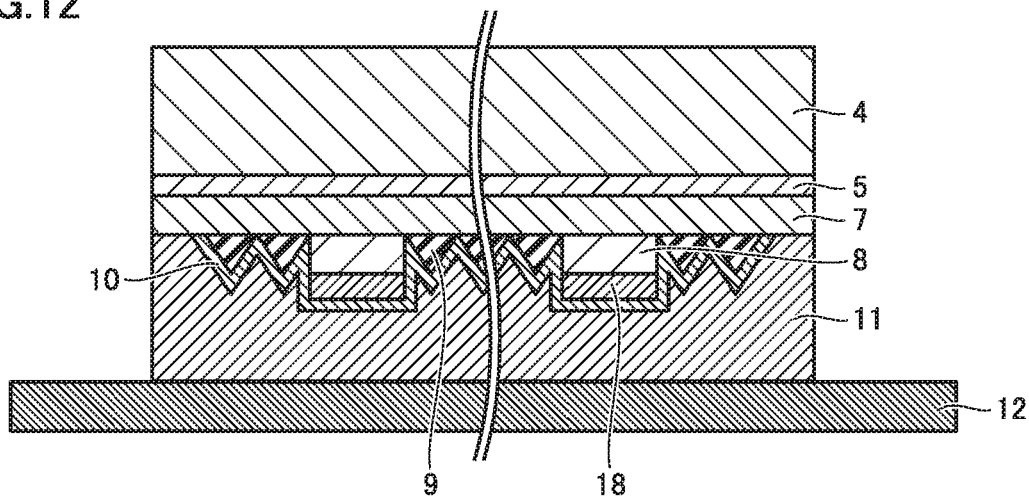
FIG. 12 is a schematic cross-sectional view illustrating a method for manufacturing the semiconductor light-emitting device according to the first embodiment.

As illustrated in FIG. 12, the AlN buffer layer 2 and the AlGaN underlayer 3 are then separated from the first conductivity type semiconductor 4. For example, the AlN buffer layer 2 and the AlGaN underlayer 3 can be separated from the first conductivity type semiconductor 4 by immersing the semiconductor wafer in hydrofluoric acid at 40° C. or more after the sapphire substrate 1 is separated. More specifically, after the sapphire substrate 1 is separated, the semiconductor wafer can be immersed in hydrofluoric acid at 60° C. for 15 minutes. In such hydrofluoric acid treatment, a residual Al inclusion of the first conductivity type semiconductor 4 characteristic of the LLO method can be removed by hydrofluoric acid. The Al inclusion can function as an etching mask and suppress the formation of pillar projections on the first conductivity type semiconductor 4, thus flattening the surface of the first conductivity type semiconductor 4. This can improve the yield in a process of forming the first electrode 13 and a process of dividing a device described later.

The surface of the first conductivity type semiconductor 4 is then partly removed by dry etching. Thus, the first main surface 4a of the first conductivity type semiconductor 4 is exposed. The first main surface 4a of the first conductivity type semiconductor 4 is exposed by dry etching, such as reactive ion etching with chlorine (Cl) gas.

A resist pattern is then formed on the first main surface 4a of the first conductivity type semiconductor 4 by photolithography. A metal film for forming the first electrode 13 is then formed on the resist pattern. The first electrode 13 is then formed by lift-off, as illustrated in FIG. 1. For example, the first electrode 13 can be formed by forming a Ti layer having a thickness of 25 nm and an Al layer having a thickness of 200 nm on the resist pattern in this order by an electron-beam evaporation method and then performing lift-off. The first electrode 13 may be formed by a known sputtering method instead of the electron-beam evaporation method.

The semiconductor wafer can be divided into semiconductor light-emitting devices illustrated in FIG. 1 by a known method, such as diamond scribing, laser scribing, blade dicing, blade breaking, or roller breaking.

Second Embodiment

Figure 13A:
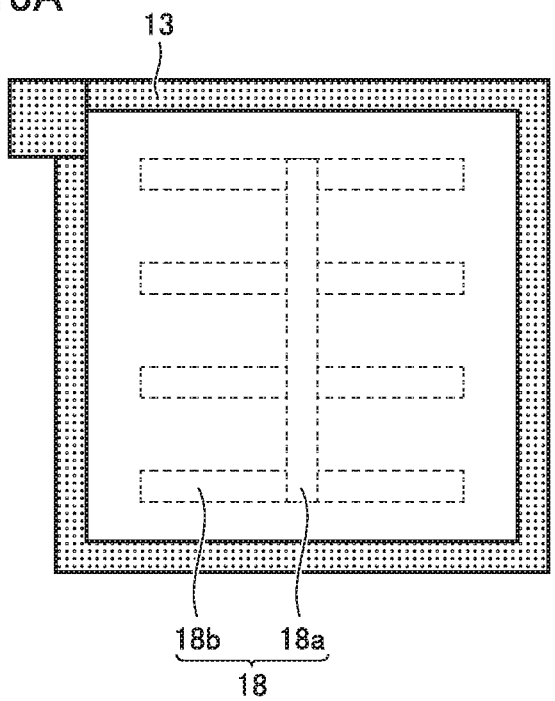
FIG. 13A is a schematic plan view illustrating the positional relationship between a first electrode and a second electrode in a semiconductor light-emitting device according to a second embodiment.
Figure 13B:
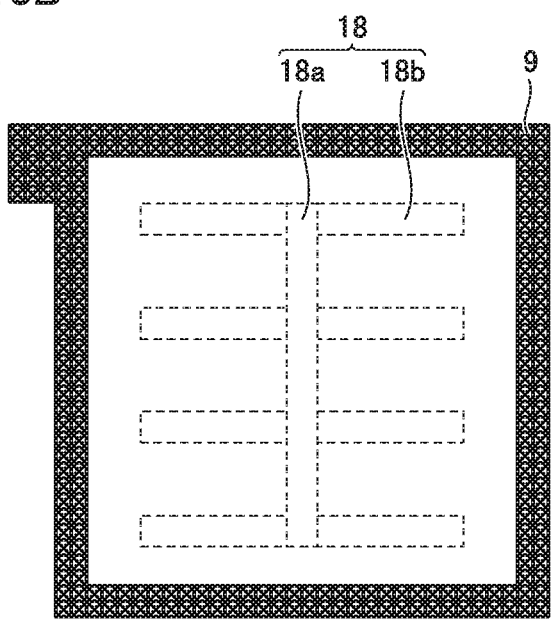
FIG. 13B is a schematic plan view illustrating the positional relationship between the first electrode and protrusions in the semiconductor light-emitting device according to the second embodiment.

FIG. 13A is a schematic plan view illustrating the positional relationship between a first electrode 13 and a second electrode 18 in a semiconductor light-emitting device according to a second embodiment. FIG. 13B is a schematic plan view illustrating the positional relationship between protrusions 9 and the second electrode 18 in the semiconductor light-emitting device according to the second embodiment. As illustrated in FIGS. 13A and 13B, in the semiconductor light-emitting device according to the second embodiment, the second electrode 18 is surrounded by the first electrode 13, and the protrusions 9 face the first electrode 13. Such a structure allows the electric current flown into an active layer 5 to diffuse in a wider region and can reduce the area of the first electrode 13, thereby improving light extraction efficiency.

The second electrode 18 includes first line electrodes 18b extending in a first direction and a second line electrode 18a extending in a second direction, which is different from the first direction. The first line electrodes 18b cross the second line electrode 18a and are electrically connected to each other with the second line electrode 18a.

Third Embodiment

Figure 14:
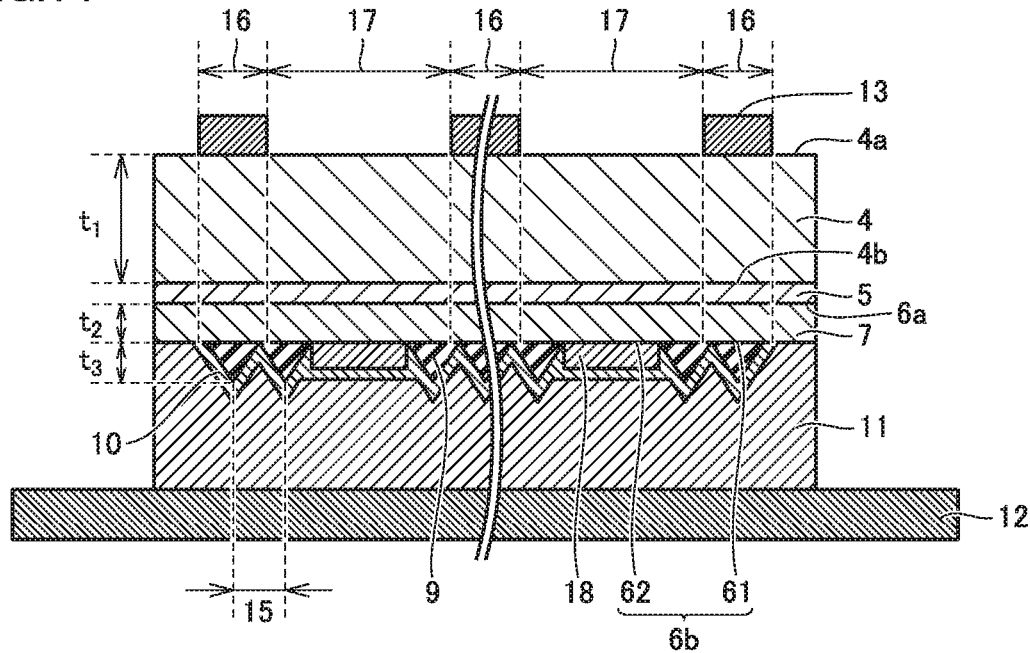
FIG. 14 is a schematic cross-sectional view of a semiconductor light-emitting device according to a third embodiment.

FIG. 14 is a schematic cross-sectional view of a semiconductor light-emitting device according to a third embodiment. As illustrated in FIG. 14, the semiconductor light-emitting device according to the third embodiment is characterized in that there is no p-type nitride semiconductor highly doped layer 8, a second conductivity type semiconductor is composed of a p-type nitride semiconductor layer 7 alone, the p-type nitride semiconductor layer 7 has a thickness $t_2$ smaller than the thickness $t_1$ of a first conductivity type semiconductor 4 and the wavelength λ1 of light emitted from an active layer 5 in the medium of protrusions 9, and the protrusions 9 have a thickness $t_3$ larger than the thickness $t_2$ of the p-type nitride semiconductor layer 7. The thickness $t_1$ of the first conductivity type semiconductor 4 is the shortest distance between a first main surface 4a and a second main surface 4b of the first conductivity type semiconductor 4. The thickness $t_2$ of the p-type nitride semiconductor layer 7 is the shortest distance between a first main surface 6a and a second main surface 6b of the p-type nitride semiconductor layer 7, which constitutes the second conductivity type semiconductor. The thickness $t_3$ of the protrusions 9 is the shortest distance between the tops and bottoms of the protrusions 9.

An increased thickness $t_1$ of the first conductivity type semiconductor 4 results in a decreased number of crystal defects and wider diffusion of the electric current from the first electrode 13. Thus, the first conductivity type semiconductor 4 has a thickness $t_1$ of 300 nm or more, for example.

However, thick p-type nitride semiconductor films have a great optical absorption loss and make it difficult to extract light. Thus, when the p-type nitride semiconductor layer 7 is a nitride semiconductor, such as p-type GaN or p-type $Al_{x2}Ga_{y2}N$ (0<x2≤1, 0≤y2<1) having a low Al content, the p-type nitride semiconductor layer 7 has a small thickness $t_2$ of 200 nm or less, for example. The p-type nitride semiconductor layer 7 having a thickness $t_2$ smaller than the thickness $t_1$ of the first conductivity type semiconductor 4 allows the electric current to flow efficiently into the active layer 5 and allows light generated in the active layer 5 to be efficiently extracted.

The intervals 15 between the protrusions 9 are greater than the wavelength of light emitted from the active layer 5 in the medium of the protrusions 9, as in the first and second embodiments, in order to control the direction of light reflection. When the emission wavelength of light emitted from the active layer 5 ranges from 220 to 350 nm, the intervals 15 between the protrusions 9 can be 660 nm or more, in order to improve light extraction efficiency.

When the thickness $t_3$ of the protrusions 9 is greater than the thickness $t_2$ of the p-type nitride semiconductor layer 7, the inclinations of the inclined surfaces of the protrusions 9 can be easily controlled. Thus, reflected light at the interface between the protrusions 9 and the metal layer 10 can be easily directed to a region that includes no first electrode 13, and the light extraction efficiency can be easily improved.

The semiconductor light-emitting device according to the third embodiment is also characterized in that the total area of a second region 17, which includes no first electrode 13 on the first main surface 4a of the first conductivity type semiconductor 4, is larger than the total area of a first region 16, which includes a first electrode 13. This can increase the amount of light extracted from the first main surface 4a of the first conductivity type semiconductor 4 and tends to further improve light extraction efficiency. In order to improve light extraction efficiency, the total area of the second region 17 can be at least three times the total area of the first region 16.

The other description of the third embodiment is basically the same as the description of the first and second embodiments and is omitted.

Fourth Embodiment

Figure 15:
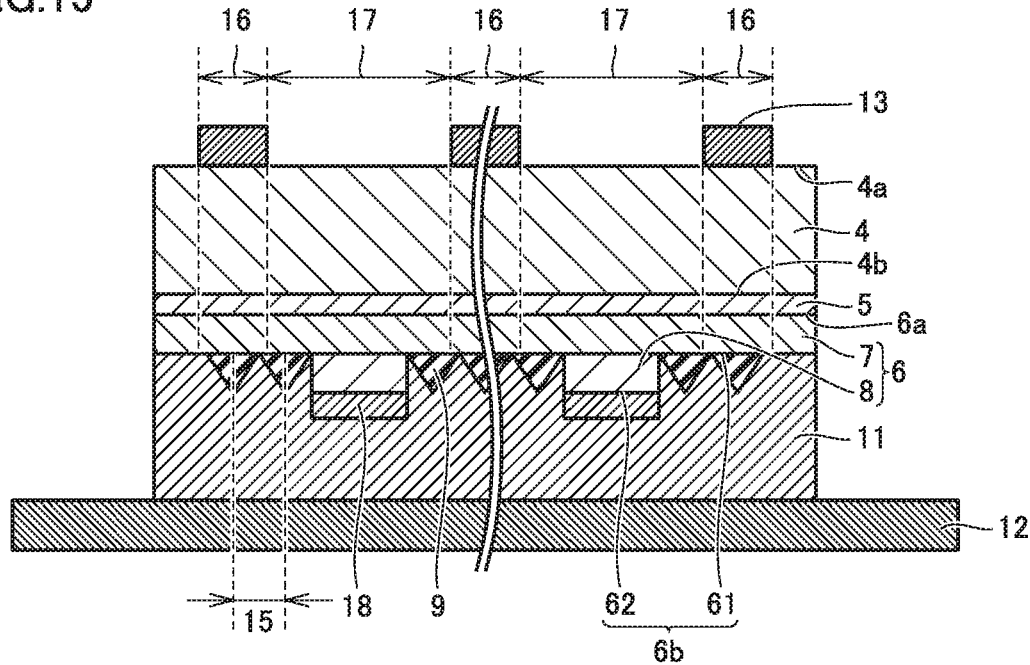
FIG. 15 is a schematic cross-sectional view of a semiconductor light-emitting device according to a fourth embodiment.

FIG. 15 is a schematic cross-sectional view of a semiconductor light-emitting device according to a fourth embodiment. The semiconductor light-emitting device according to the fourth embodiment is characterized in that there is no metal layer 10, and protrusions 9 and an electrically conductive bonding layer 11 form a reflection interface. Such a structure can also reduce the amount of light passing through the reflection interface between the protrusions 9 and the electrically conductive bonding layer 11. Furthermore, a process of manufacturing the semiconductor light-emitting device according to the fourth embodiment can be simplified without a process of forming a metal layer 10, thus resulting in lower manufacturing costs.

The other description of the fourth embodiment is basically the same as the description of the first to third embodiments and is omitted.

Fifth Embodiment

Figure 16A:
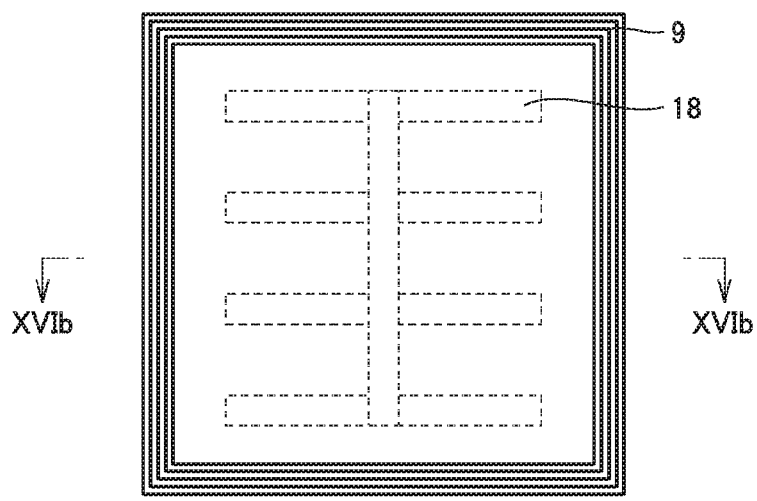
FIG. 16A is a schematic plan view illustrating the positional relationship between protrusions and a second electrode in a semiconductor light-emitting device according to a fifth embodiment.
Figure 16B:
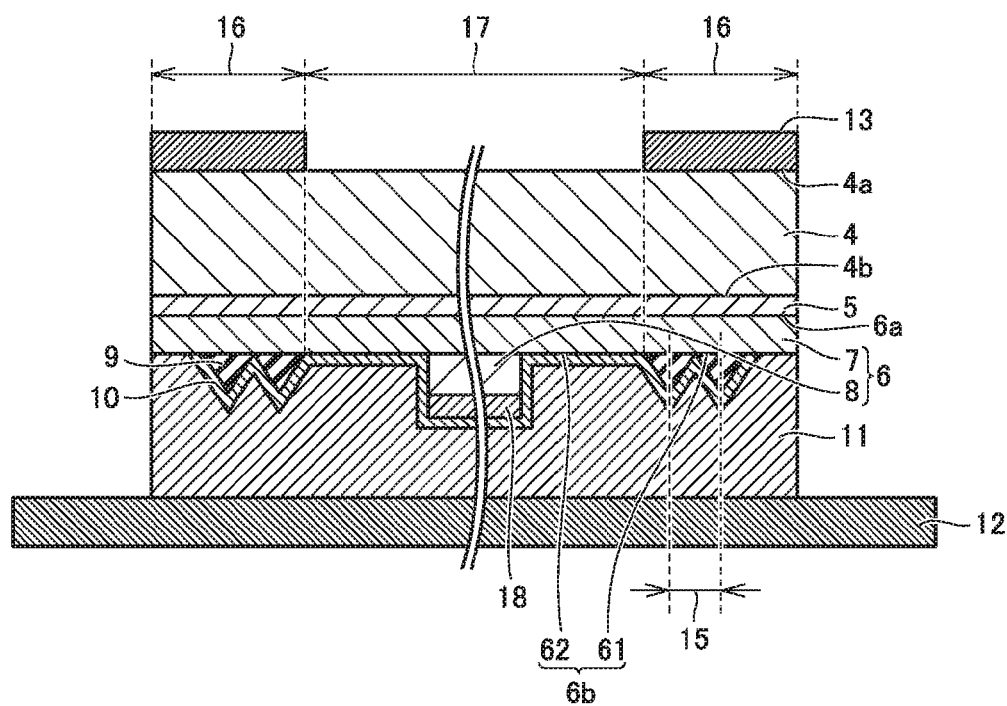
FIG. 16B is a schematic cross-sectional view taken along the line XVIb-XVIb in FIG. 16A.

FIG. 16A is a schematic plan view illustrating the positional relationship between protrusions 9 and a second electrode 18 in a semiconductor light-emitting device according to a fifth embodiment. FIG. 16B is a schematic cross-sectional view taken along the line XVIb-XVIb in FIG. 16A. The semiconductor light-emitting device according to the fifth embodiment is characterized in that the protrusions 9 have the shape of stripes of triangular prisms extending along the periphery of the device.

The other description of the fifth embodiment is basically the same as the description of the first to fourth embodiments and is omitted.

Sixth Embodiment

Figure 17A:
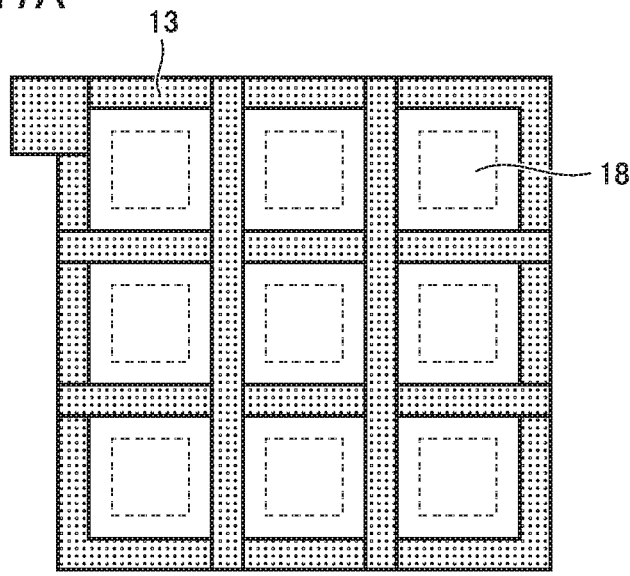
FIG. 17A is a schematic plan view illustrating the positional relationship between a first electrode and second electrodes in a semiconductor light-emitting device according to a sixth embodiment.
Figure 17B:
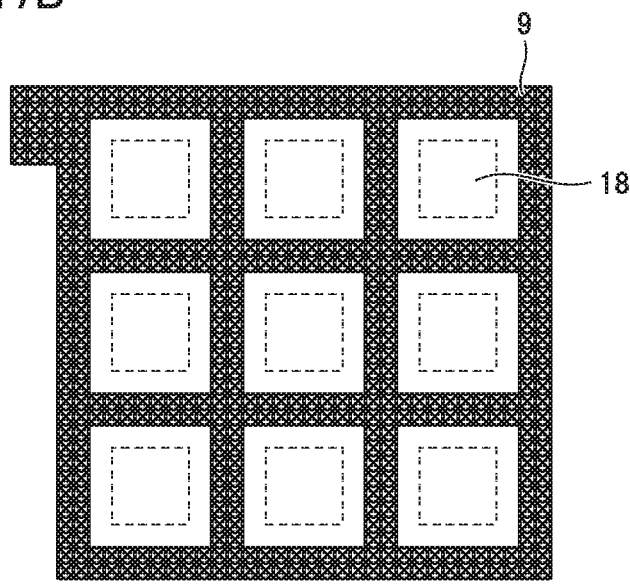
FIG. 17B is a schematic plan view illustrating the positional relationship between protrusions and the second electrodes in the semiconductor light-emitting device according to the sixth embodiment.

FIG. 17A is a schematic plan view illustrating the positional relationship between a first electrode 13 and second electrodes 18 in a semiconductor light-emitting device according to a sixth embodiment. FIG. 17B is a schematic plan view illustrating the positional relationship between protrusions 9 and the second electrodes 18 in the semiconductor light-emitting device according to the sixth embodiment. The semiconductor light-emitting device according to the sixth embodiment is characterized in that the second electrodes 18 are separated from each other. The first electrode 13 has a grid-like pattern, and the second electrodes 18 are rectangular. Each of the rectangular second electrodes 18 faces a corresponding rectangular region within the first electrode 13. Such a structure also allows the electric current to flow into a wider region of an active layer 5 and can reduce the area of the first electrode 13, thereby improving light extraction efficiency.

The other description of the sixth embodiment is basically the same as the description of the first to fifth embodiments and is omitted.

Seventh Embodiment

Figure 18A:
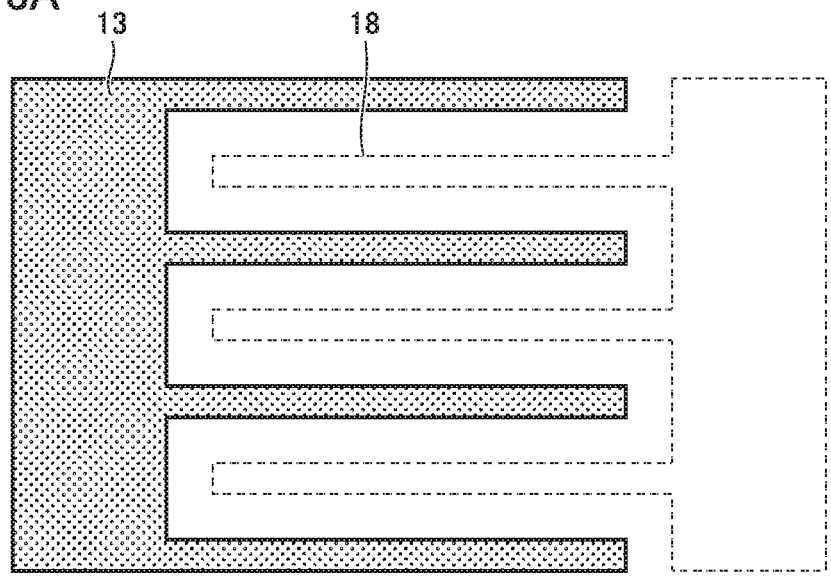
FIG. 18A is a schematic plan view illustrating the positional relationship between a first electrode and a second electrode in a semiconductor light-emitting device according to a seventh embodiment.
Figure 18B:
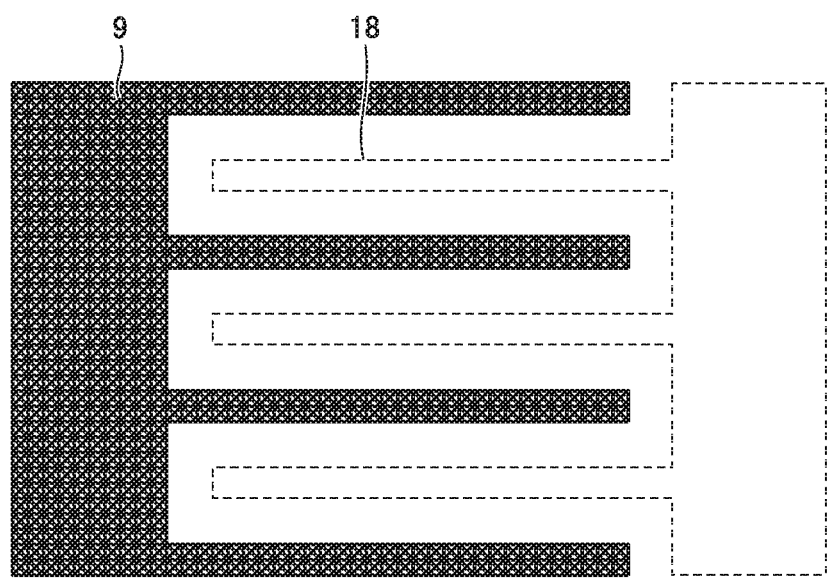
FIG. 18B is a schematic plan view illustrating the positional relationship between protrusions and the second electrode in the semiconductor light-emitting device according to the seventh embodiment.

FIG. 18A is a schematic plan view illustrating the positional relationship between a first electrode 13 and a second electrode 18 in a semiconductor light-emitting device according to a seventh embodiment. FIG. 18B is a schematic plan view illustrating the positional relationship between protrusions 9 and the second electrode 18 in the semiconductor light-emitting device according to the seventh embodiment. The semiconductor light-emitting device according to the seventh embodiment is characterized in that the first electrode 13 and the second electrode 18 are comb-like and interdigitated. Such a structure also allows the electric current to flow into the entire active layer 5 and can reduce the area of the first electrode 13, thereby improving light extraction efficiency.

The other description of the seventh embodiment is basically the same as the description of the first to sixth embodiments and is omitted.

Eighth Embodiment

Figure 19:
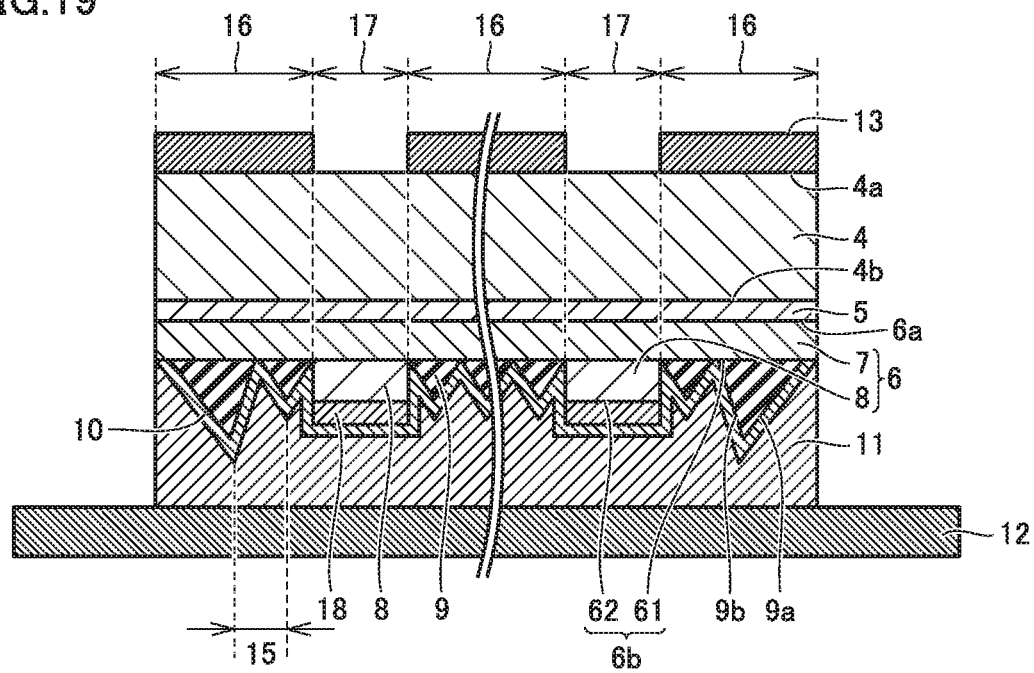
FIG. 19 is a schematic cross-sectional view of a semiconductor light-emitting device according to an eighth embodiment.

FIG. 19 is a schematic cross-sectional view of a semiconductor light-emitting device according to an eighth embodiment. The semiconductor light-emitting device according to the eighth embodiment is characterized in that protrusions 9 have a triangular cross section and, in a triangular cross section of one of the protrusions 9 closest to the periphery of the semiconductor light-emitting device, a side 9a of the closest protrusion 9 adjacent to the periphery of the semiconductor light-emitting device is longer than a side 9b of the closest protrusion 9 away from the periphery of the semiconductor light-emitting device. In such a structure, the protrusion 9 closest to the periphery of the semiconductor light-emitting device can return light emitted outward from the semiconductor light-emitting device to the inside of the semiconductor light-emitting device and thereby improve light extraction efficiency. In order to further improve light extraction efficiency, one of the protrusions 9 closest to the periphery of the semiconductor light-emitting device can have a right-angled triangular cross section in which a side 9a of the closest protrusion 9 adjacent to the periphery of the semiconductor light-emitting device is longer than an inner side 9b.

The other description of the eighth embodiment is basically the same as the description of the first to seventh embodiments and is omitted.

Supplementary Notes (1) An embodiment disclosed herein is a semiconductor light-emitting device containing $Al_xGa_yN$ ($0<x\leq1$, $0\leq y<1$) that includes a first conductivity type semiconductor, a second conductivity type semiconductor, an active layer between the first conductivity type semiconductor and the second conductivity type semiconductor, a first electrode disposed on a first main surface of the first conductivity type semiconductor, a second electrode disposed on a second main surface of the second conductivity type semiconductor, and a plurality of protrusions disposed on the second main surface of the second conductivity type semiconductor. The first main surface of the first conductivity type semiconductor faces the second main surface of the second conductivity type semiconductor with the first conductivity type semiconductor, the active layer, and the second conductivity type semiconductor interposed therebetween. The protrusions are disposed in at least part of a region of the second main surface of the second conductivity type semiconductor facing each of the first electrodes. The second electrode is disposed in at least part of a region of the second main surface of the second conductivity type semiconductor other than the region in which the protrusions are disposed. The protrusions protrude from the second main surface of the second conductivity type semiconductor in a direction away from the active layer. The protrusions contain a dielectric material. The protrusions are separated by an interval longer than the wavelength of light emitted from the active layer in the medium of the protrusions. Such a structure can provide a semiconductor light-emitting device containing $Al_xGa_yN$ ($0<x\leq1$, $0\leq y<1$) having improved light extraction efficiency.

(2) A semiconductor light-emitting device according to an embodiment disclosed herein may further include a metal layer covering protrusions. Such a structure can also provide a semiconductor light-emitting device containing $Al_xGa_yN$ ($0<x\leq1$, $0\leq y<1$) having improved light extraction efficiency.

(3) In a semiconductor light-emitting device according to an embodiment disclosed herein, a metal layer may be disposed on a second electrode. Such a structure can also provide a semiconductor light-emitting device containing $Al_xGa_yN$ ($0<x\leq1$, $0\leq y<1$) having improved light extraction efficiency.

(4) A semiconductor light-emitting device according to an embodiment disclosed herein may further include an electrically conductive substrate and an electrically conductive bonding layer for bonding the electrically conductive substrate and a metal layer together. Such a structure can also provide a semiconductor light-emitting device containing $Al_xGa_yN$ ($0<x\leq1$, $0\leq y<1$) having improved light extraction efficiency.

(5) A semiconductor light-emitting device according to an embodiment disclosed herein may further include an electrically conductive substrate and an electrically conductive bonding layer for bonding the electrically conductive substrate and protrusions. Such a structure can also provide a semiconductor light-emitting device containing $Al_xGa_yN$ ($0<x\leq1$, $0\leq y<1$) having improved light extraction efficiency.

(6) In a semiconductor light-emitting device according to an embodiment disclosed herein, an electrically conductive bonding layer may be disposed on and electrically connected to a second electrode. Such a structure can also provide a semiconductor light-emitting device containing $Al_xGa_yN$ ($0<x\leq1$, $0\leq y<1$) having improved light extraction efficiency.

(7) In a semiconductor light-emitting device according to an embodiment disclosed herein, a second conductivity type semiconductor may include a projection in at least part of a second region of the second conductivity type semiconductor in a direction away from an active layer. Such a structure can also provide a semiconductor light-emitting device containing $Al_xGa_yN$ ($0<x\leq1$, $0\leq y<1$) having improved light extraction efficiency.

(8) In a semiconductor light-emitting device according to an embodiment disclosed herein, a second electrode may be disposed on a projection of a second conductivity type semiconductor. Such a structure can also provide a semiconductor light-emitting device containing $Al_xGa_yN$ ($0<x\leq1$, $0\leq y<1$) having improved light extraction efficiency.

(9) In a semiconductor light-emitting device according to an embodiment disclosed herein, a projection of a second conductivity type semiconductor may contain magnesium. Such a structure can also provide a semiconductor light-emitting device containing $Al_xGa_yN$ ($0<x\le1$, $0\le y<1$) having improved light extraction efficiency.

(10) In a semiconductor light-emitting device according to an embodiment disclosed herein, protrusions may be disposed in a region other than a projection of a second conductivity type semiconductor. Such a structure can also provide a semiconductor light-emitting device containing $Al_xGa_yN$ ($0<x\le1$, $0\le y<1$) having improved light extraction efficiency.

(11) In a semiconductor light-emitting device according to an embodiment disclosed herein, a second electrode may include first line electrodes extending in a first direction and a second line electrode extending in a second direction, which is different from the first direction, and the first line electrodes may cross the second line electrode. Such a structure can also provide a semiconductor light-emitting device containing $Al_xGa_yN$ ($0<x\le1$, $0\le y<1$) having improved light extraction efficiency.

(12) In a semiconductor light-emitting device according to an embodiment disclosed herein, there may be second electrodes separated from each other. Such a structure can also provide a semiconductor light-emitting device containing $Al_xGa_yN$ ($0<x\le1$, $0\le y<1$) having improved light extraction efficiency.

(13) In a semiconductor light-emitting device according to an embodiment disclosed herein, a first electrode and a second electrode may be comb-like and interdigitated. Such a structure can also provide a semiconductor light-emitting device containing $Al_xGa_yN$ ($0<x\le1$, $0\le y<1$) having improved light extraction efficiency.

(14) In a semiconductor light-emitting device according to an embodiment disclosed herein, a second conductivity type semiconductor may have a thickness smaller than the thickness of a first conductivity type semiconductor and the wavelength of light emitted from an active layer in the medium of protrusions, and the protrusions may have a greater thickness than the second conductivity type semiconductor. Such a structure can also provide a semiconductor light-emitting device containing $Al_xGa_yN$ ($0<x\le1$, $0\le y<1$) having improved light extraction efficiency.

(15) In a semiconductor light-emitting device according to an embodiment disclosed herein, the thickness of a first conductivity type semiconductor may be the shortest distance between a first main surface and a second main surface of the first conductivity type semiconductor. The second main surface faces the first main surface and an active layer. Such a structure can also provide a semiconductor light-emitting device containing $Al_xGa_yN$ ($0<x\le1$, $0\le y<1$) having improved light extraction efficiency.

(16) In a semiconductor light-emitting device according to an embodiment disclosed herein, a region of a first main surface of a first conductivity type semiconductor in which a first electrode is not disposed may have a larger total area than a region in which the first electrode is disposed. Such a structure can also provide a semiconductor light-emitting device containing $Al_xGa_yN$ ($0<x\le1$, $0\le y<1$) having improved light extraction efficiency.

(17) In a semiconductor light-emitting device according to an embodiment disclosed herein, protrusions may be quadrangular pyramids. Such a structure can also provide a semiconductor light-emitting device containing $Al_xGa_yN$ ($0<x\le1$, $0\le y<1$) having improved light extraction efficiency.

(18) In a semiconductor light-emitting device according to an embodiment disclosed herein, protrusions may have the shape of stripes of triangular prisms extending along the periphery of the semiconductor light-emitting device. Such a structure can also provide a semiconductor light-emitting device containing $Al_xGa_yN$ ($0<x\le1$, $0\le y<1$) having improved light extraction efficiency.

(19) In a semiconductor light-emitting device according to an embodiment disclosed herein, protrusions may have a triangular cross section and, in a triangular cross section of one of the protrusions closest to the periphery of the semiconductor light-emitting device, a side of the closest protrusion adjacent to the periphery of the semiconductor light-emitting device may be longer than a side of the closest protrusion away from the periphery of the semiconductor light-emitting device. Such a structure can also provide a semiconductor light-emitting device containing $Al_xGa_yN$ ($0<x\le1$, $0\le y<1$) having improved light extraction efficiency.

(20) In a semiconductor light-emitting device according to an embodiment disclosed herein, a protrusion closest to the periphery of the semiconductor light-emitting device may have a right-angled triangular cross section in which a side of the protrusion adjacent to the periphery of the semiconductor light-emitting device is longer than an inner side of the protrusion. Such a structure can also provide a semiconductor light-emitting device containing $Al_xGa_yN$ ($0<x\le1$, $0\le y<1$) having improved light extraction efficiency.

(21) In a semiconductor light-emitting device according to an embodiment disclosed herein, an active layer may contain $Al_xGa_yN$ ($0<x\le1$, $0\le y<1$). Such a structure can also provide a semiconductor light-emitting device containing $Al_xGa_yN$ ($0<x\le1$, $0\le y<1$) having improved light extraction efficiency.

(22) A semiconductor light-emitting device according to an embodiment disclosed herein may have an emission wavelength in the range of 220 to 350 nm. Such a structure can also provide a semiconductor light-emitting device containing $Al_xGa_yN$ ($0<x\le1$, $0\le y<1$) having improved light extraction efficiency.

(23) In a semiconductor light-emitting device according to an embodiment disclosed herein, the intervals between protrusions may be 660 nm or more. Such a structure can also provide a semiconductor light-emitting device containing $Al_xGa_yN$ ($0<x\le1$, $0\le y<1$) having improved light extraction efficiency.

These embodiments are originally envisaged to be combined as required.

It is to be understood that the embodiments disclosed herein are illustrated by way of example and not by way of limitation in all respects. The scope of the present disclosure is defined by the appended claims rather than by the description preceding them. All modifications that fall within the scope of the claims and the equivalents thereof are therefore intended to be embraced by the claims.

An embodiment disclosed herein relates to a semiconductor light-emitting device containing $Al_xGa_yN$ ($0<x\le1$, $0\le y<1$) and a method for manufacturing the semiconductor light-emitting device and more particularly to a method for manufacturing a semiconductor light-emitting device including a process of removing a semiconductor growth substrate from a semiconductor wafer by a laser lift-off (LLO) method and a semiconductor light-emitting device manufactured by the method.

The present disclosure contains subject matter related to that disclosed in Japanese Priority Patent Application JP 2015-245130 filed in the Japan Patent Office on Dec. 16, 2015, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light-emitting device containing $Al_xGa_yN$ (where, $0<x\leq1$, $0\leq y<1$), comprising:
   a first conductivity type semiconductor;
   a second conductivity type semiconductor;
   an active layer between the first conductivity type semiconductor and the second conductivity type semiconductor, the active layer being defined by a single continuous layer;
   a first electrode disposed on a first main surface of the first conductivity type semiconductor;
   a second electrode disposed on a second main surface of the second conductivity type semiconductor; and
   a plurality of protrusions disposed on the second main surface of the second conductivity type semiconductor and facing the first electrode with the active layer interposed therebetween, wherein
   the first main surface of the first conductivity type semiconductor faces the second main surface of the second conductivity type semiconductor with the first conductivity type semiconductor, the active layer, and the second conductivity type semiconductor interposed therebetween,
   the protrusions are disposed in at least a portion of a region of the second main surface of the second conductivity type semiconductor facing the first electrode,
   the second electrode is disposed in at least a portion of a region of the second main surface of the second conductivity type semiconductor other than the portion of the region in which the protrusions are disposed,
   the protrusions protrude from the second main surface of the second conductivity type semiconductor in a direction away from the active layer,
   the protrusions contain a dielectric material, and
   the protrusions are separated by an interval longer than a wavelength of light emitted from the active layer in a medium of the protrusions.

2. The semiconductor light-emitting device according to claim 1, further comprising a metal layer covering the protrusions.

3. The semiconductor light-emitting device according to claim 1, further comprising:
   an electrically conductive substrate; and
   an electrically conductive bonding layer to bond the electrically conductive substrate and a metal layer together.

4. The semiconductor light-emitting device according to claim 1, wherein
   the second conductivity type semiconductor has a thickness smaller than a thickness of the first conductivity type semiconductor and the wavelength of light emitted from the active layer in the medium of the protrusions, and
   the protrusions have a greater thickness than the second conductivity type semiconductor.

5. The semiconductor light-emitting device according to claim 1, wherein a region of the first main surface of the first conductivity type semiconductor in which the first electrode is not disposed has a larger total area than a region in which the first electrode is disposed.

6. The semiconductor light-emitting device according to claim 1, further comprising a projection in at least a portion of the second conductivity type semiconductor, the projection extending in a direction away from the active layer.

7. The semiconductor light-emitting device according to claim 6, wherein the second electrode is disposed on the projection of the second conductivity type semiconductor.

8. The semiconductor light-emitting device according to claim 6, wherein the projection of the second conductivity type semiconductor includes magnesium.

9. The semiconductor light-emitting device according to claim 6, wherein the protrusions are disposed in the region other than the projection of the second conductivity type semiconductor.

10. The semiconductor light-emitting device according to claim 1, wherein
    the second electrode includes first line electrodes extending in a first direction and a second line electrode extending in a second direction, and
    the first line electrodes cross the second line electrode.

11. The semiconductor light-emitting device according to claim 1, further comprising a plurality of the second electrodes separated from each other.

12. The semiconductor light-emitting device according to claim 1, wherein the first electrode and the second electrode are comb-shaped and interdigitated.

13. The semiconductor light-emitting device according to claim 1, wherein the protrusions are quadrangular pyramids.

14. The semiconductor light-emitting device according to claim 1, wherein the protrusions have a shape of stripes of triangular prisms extending along a periphery of the semiconductor light-emitting device.

15. The semiconductor light-emitting device according to claim 1, wherein the protrusions have a triangular cross section and, in a triangular cross section of one of the protrusions closest to a periphery of the semiconductor light-emitting device, a side of the closest protrusion adjacent to the periphery of the semiconductor light-emitting device is longer than a side of the closest protrusion away from the periphery of the semiconductor light-emitting device.

16. The semiconductor light-emitting device according to claim 1, wherein one of the protrusions which is closest to a periphery of the semiconductor light-emitting device has a right-angled triangular cross section in which a side of the one of the protrusions adjacent to the periphery of the semiconductor light-emitting device is longer than an inner side of the one of the protrusions.

17. The semiconductor light-emitting device according to claim 1, wherein the semiconductor light-emitting device has an emission wavelength in the range of 220 nm to 350 nm.

18. The semiconductor light-emitting device according to claim 1, wherein intervals between the protrusions are 660 nm or more.

* * * * *